United States Patent [19]

Leppert

[11] Patent Number: 4,695,107
[45] Date of Patent: Sep. 22, 1987

[54] INTEGRATED CIRCUIT SOCKETS

[76] Inventor: James B. Leppert, 903 Frankewitz Rd., Baltimore, Md. 21221

[21] Appl. No.: 871,848

[22] Filed: Jun. 9, 1986

[51] Int. Cl.⁴ .................... H01R 13/05; H01R 9/09
[52] U.S. Cl. .................................. 439/83; 439/389; 439/869; 439/488
[58] Field of Search ............ 339/17 C, 220 R, 220 A, 339/220 C, 220 L, 220 T, 252 R, 252 P, 275 R, 275 B, 221 L, 221 R, 221 M

[56] References Cited

U.S. PATENT DOCUMENTS

| | | | |
|---|---|---|---|
| 3,103,547 | 9/1963 | Ansley | 339/275 B |
| 3,145,069 | 8/1964 | Damon et al. | 339/221 R |
| 3,428,934 | 2/1969 | Reider, Jr. et al. | 339/275 R |
| 3,524,161 | 8/1970 | Frantz et al. | 339/220 R |
| 3,543,215 | 11/1970 | Jones | 339/221 R |
| 4,178,061 | 12/1979 | Ahroni | 339/147 P |

FOREIGN PATENT DOCUMENTS

| | | | |
|---|---|---|---|
| 2653442 | 5/1977 | Fed. Rep. of Germany | 339/275 R |
| 44536 | 4/1966 | German Democratic Rep. | 339/220 R |
| 266177 | 7/1964 | Netherlands | 339/17 C |

OTHER PUBLICATIONS

"Component Mounting and Wire Wrapping Contact", IBM Tech. Disclosure Bulletin, vol. 5, No. 5, Oct. 1962, 339/17C.

Primary Examiner—Gil Weidenfeld
Assistant Examiner—Gary F. Pauman
Attorney, Agent, or Firm—John F. McClellan, Sr.

[57] ABSTRACT

A novel integrated circuit socket provides splash-preventing capillary action improving half-round section pins that seat better by means of a conical longitudinal shape that wedges in holes in conventional printed circuit boards. The pins have P.C. board top-track contacting spurs at an upper portion that serve two purposes: they improve capillary action and they reduce bellying (i.e. flexing) of the I.C. socket during assembly to the P.C. Board. The invention provides improved visibility by co-action of transparent material of which the I.C. socket is made, with a plurality of Fresnel lenses molded in the bottom surface of the I.C. socket.

3 Claims, 2 Drawing Figures

OLD ART

INTEGRATED CIRCUIT SOCKETS

FIELD OF THE INVENTION

This invention relates generally to improved integrated circuit sockets (I.C. sockets) and the like, and particularly to provision of new pinning and a new dielectric compound for use in conjunction therewith.

BACKGROUND OF THE INVENTION

In the prior art, problems have arisen with soldering causing shorts and open circuits in between the pins and the upper or lower tracks of the circuit board, requiring pulling components such as integrated sockets off the board to try to locate the shorts and open circuits. Rejection rates of up to twelve percent of the I.C. sockets have resulted, and inspection has been very difficult. The shorts and open circuits are the direct result of misalignment of pins with holes upon insertion, and of solder splashes from wave soldering, and of lack of proper migration of solder during wave soldering. No means of preventing these problems has been known, to the best of this inventor's knowledge.

SUMMARY OF THE INVENTION

The present invention has as a primary object the care of these problems generally.

A further object is specifically to provide for improved capillary action and for improved point-to-point contact by means of a new pin design.

A still further object is by means of the new pin design to reduce or eliminate solder splashing and to give a more secure union of the socket and the printed circuit (P.C.) board and to reduce bellying (i.e. flexing) upon joining together of same.

Yet further objects are to provide unique positioning spurs that insure proper seating of socket-to-circuit board upon initial assembly and any replacement assembly.

And a further important object is to provide good visual access in areas where the components are tight together and in the past which have been closed to visual inspection. For this, a plurality of Fresnel lenses coact with a transparent base on the bottom of which they are formed.

And still further objects are to provide sockets that have more durable pinning and are better suited for replacement purposes than present sockets.

BRIEF DESCRIPTION OF THE DRAWINGS

The above and other objects and advantages of the invention will be more readily appreciated upon examination of the drawings, in which similar characters refer to like parts.

DETAILED DESCRIPTION

Figure 1:
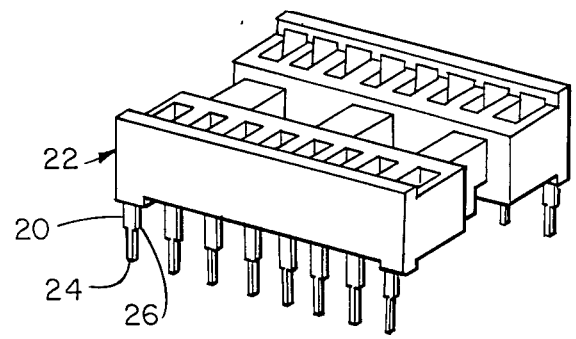
FIG. 1 is a perspective view of an old art socket.

FIG. 1 shows the relatively weak structure of conventional I.C. pins 20 in a socket 22. The socket is typically of opaque material, making visual inspection difficult, and, in use, the pins 20, because of the solid design, and thin tips 24 below the shoulders 26 have a tendency to roll under and to short. No amount of experience in using such apparatus can compensate for these deficiencies. Structure generally of the I.C. socket may be like that of a typical socket made, and sold by Sylvania under "Sylvania ECG 435P20".

Figure 2:
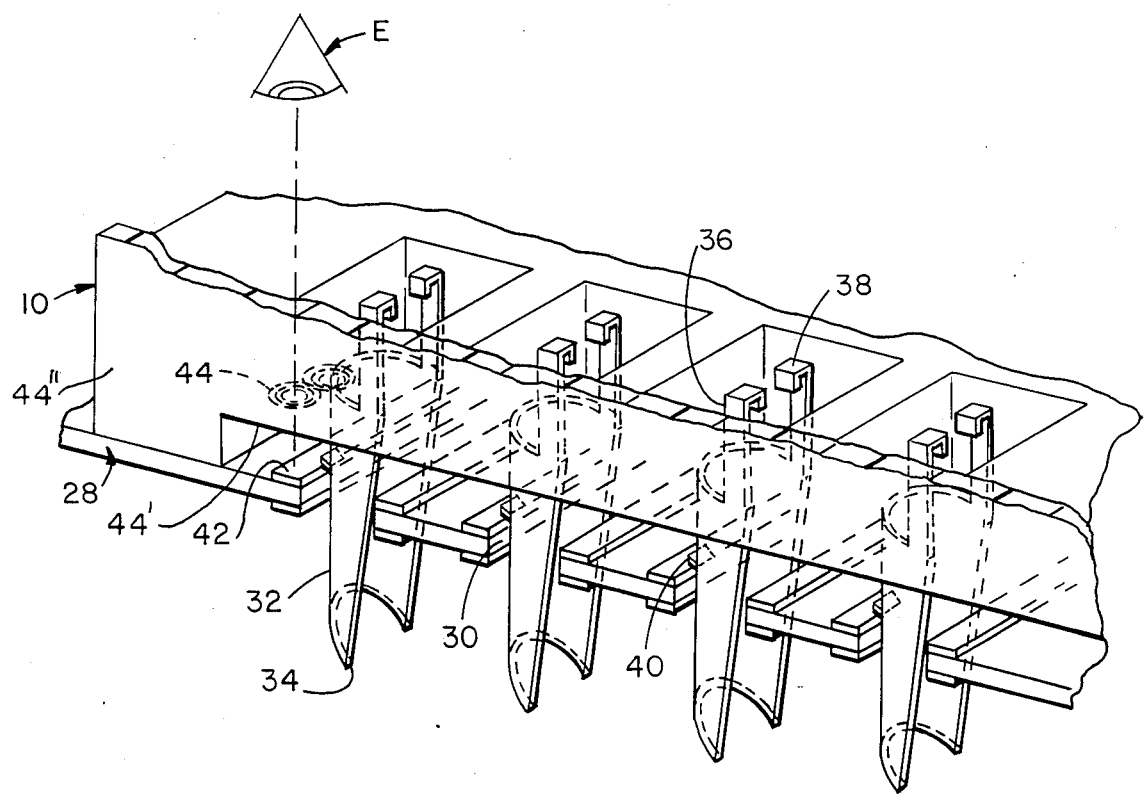
FIG. 2 is a fragmentary detail view on a larger scale of a socket portion in engagement with a conventional printed circuit board, in use in accordance with this invention.

FIG. 2 shows a typical portion of the invention of a preferred embodiment, an integrated circuit socket 10 in assembly with a conventional P.C. board 28. The P.C. board may be a standard board such as, for example, a single-side or double-side copper laminate clad board and may be of fibreglass, epoxy resin or glass. No modification is required for use with the socket structure of this invention. The holes 30 may be typically of the plated-through type when double-sided boards are used. Although single-sided P.C. boards are not plated-through, this invention will be especially helpful with them, as will be seen.

The invention in embodiment 10 is conventional only in size, pin-spacing, pin material, side wipes, and seat location. Every other feature is new.

PINS

Instead of the solid, shouldered, thin tipped structure of typical pins, the pins 32 of this invention may be half-round or generally half-circles about the pin axis in cross-sectional view, and longitudinally may be slightly conical with the larger end up, and have tapered, sharp, chisel-like tips 34 on the lower end. This half-round tapered, sharp shape aids alignment for insertion into PC boards. The tapered shape produces a firm wedge-contact for seating at the upper end and reducing undirected solder splashing and the upper part of the pin provides conventional side wipes 36, 38. The board support of the molded-in-place upper ends and sharp lower ends of the conical shape reduce bellying (i.e. flexing) on the unit 10 upon assembly.

In wave soldering, solder can advantageously splash up through the hollow center of the pins and, through the aid of the positioning spurs 40, make good contact on the top rails on the P.C. board. The positioning spurs 40 are simply preferably rectangular lanced-out portions of the pins on the rear or rounded sides. The pins may be of nickel-plated brass.

VISIBILITY

The I.C. circuit socket 10 may be of any suitable transparent substance such as clear polystyrene, or a clear polycarbonate such as is sold under the trademark "Nylon". Visibility is provided additionally (as at eye "E" above) of the top copper or upper track 42 of the P.C. board by the co-action of the clear material with a plurality of Fresnel lenses 44 formed in the bottom surface 44' of the base 44" the I.C. socket board, throughout.

Obviously many modifications and variations of the present invention are possible in the light of the above teachings.

As examples, 3, 4, 8, 16 pin transistor sockets and 8-to-289 pin I.C. sockets may be used.

It is therefore to be understood that within the rope of the appended claims the invention may be practiced otherwise than as specifically described.

What is claimed and desired to be protected by United States Letters Patent is:

1. In a system of integrated circuit sockets having: a base with a bottom surface and a plurality of pins in spaced rows in said base for engaging respective holes in a printed circuit board having, adjacent said holes, upper copper tracks, and at least one side wipe 936, 38)

associated with each of said pins, the improvement comprising: each said pin (32) being a half circle in cross-sectional view and being conically tapered longitudinally with a sharp chisel tip at one extreme end (34), said half circular cross section extending from said sharp chisel tip substantially to said at least one side wipe at the other end of said pin, and a spur (40) on each pin extending to a location for resting on a said upper copper track (42) and serving as a path for conveying solder to a said upper copper track (42).

2. In a system of integrated circuit sockets having: a base with a bottom surface and a plurality of pins in spaced rows in said base for engaging respective holes in a printed circuit board having, adjacent said holes, upper copper tracks, and at least one side wipe 936, 38) associated with each of said pins, the improvement comprising: each said pin (32) being a half circle in cross-sectional view and being conically tapered longitudinally with a sharp chisel tip at one extreme end (34), said half circular cross section extending from said sharp chisel tip substantially to said at least one side wipe at the other end of said pin, a spur (40) on each pin extending to a location for resting on a said upper copper track (42) and serving as a path for conveying solder to a said upper copper track (42), means aiding visibility of said pins (32) from above, comprising said base (10') being of a transparent substance, and means further aiding visibility of said pins (32) from above including a plurality of lenses (44) molded in said bottom surface (44') of the base.

3. In a system of integrated circuit sockets having a base with a bottom surface and a plurality of pins in spaced rows in said base for engaging respective holes in a printed circuit board having, adjacent said holes, upper copper tracks, and at least one side wipe 936, 38) associated with each of said pins, the improvement comprising: each said pin (32) being a half circle in cross-sectional view and being conically tapered longitudinally with a sharp chisel tip at one extreme end (34), said half circular cross section extending from said sharp chisel tip substantially to said at least one side wipe at the other end of said pin, a spur (40) on each pin extending to a location for resting on a said upper copper track (42) and serving as a path for conveying solder to a said upper copper track (42), means aiding visibility of said pins (32) from above, comprising said base (10') being of a transparent substance, and means further aiding visibility of said pins (32) from above including a plurality of lenses (44) molded in said bottom surface (44') of the base above said copper track.

* * * * *